United States Patent
Notsu et al.

(10) Patent No.: US 10,319,767 B2
(45) Date of Patent: Jun. 11, 2019

(54) ELECTRONIC COMPONENT INCLUDING AN OPTICAL MEMBER FIXED WITH ADHESIVE

(71) Applicant: CANON KABUSHIKI KAISHA, Tokyo (JP)

(72) Inventors: Kazuya Notsu, Yokohama (JP); Koji Tsuduki, Kawasaki (JP); Kunihiro Abe, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/587,631

(22) Filed: May 5, 2017

(65) Prior Publication Data
US 2017/0338267 A1    Nov. 23, 2017

(30) Foreign Application Priority Data
May 19, 2016 (JP) .................... 2016-100329

(51) Int. Cl.
  *H01L 27/146* (2006.01)
  *H04N 5/225* (2006.01)

(52) U.S. Cl.
  CPC .. *H01L 27/14627* (2013.01); *H01L 27/14618* (2013.01); *H01L 27/14625* (2013.01); *H04N 5/2253* (2013.01); *H04N 5/2254* (2013.01); *H01L 2224/73265* (2013.01); *H01L 2924/16195* (2013.01)

(58) Field of Classification Search
None
See application file for complete search history.

(56) References Cited

U.S. PATENT DOCUMENTS

| | | | |
|---|---|---|---|
| 2004/0211882 A1* | 10/2004 | Hsieh | H01L 27/14618 250/208.1 |
| 2005/0173811 A1* | 8/2005 | Kinsman | H01L 24/97 257/784 |
| 2007/0004080 A1 | 1/2007 | Ouyang | |
| 2010/0051982 A1* | 3/2010 | Lin | H01L 33/486 257/98 |
| 2010/0122927 A1 | 5/2010 | Matsuoka | |
| 2010/0155869 A1* | 6/2010 | Komori | H01L 27/14618 257/432 |
| 2011/0089449 A1* | 4/2011 | Chou | H01L 33/486 257/98 |

(Continued)

FOREIGN PATENT DOCUMENTS

| JP | 3045913 B2 | 5/2000 |
|---|---|---|
| JP | 2003-163341 A | 6/2003 |

(Continued)

OTHER PUBLICATIONS

Machine Translation of JP2002359314 (Year: 2002).*

*Primary Examiner* — Andres Munoz
(74) *Attorney, Agent, or Firm* — Canon U.S.A.Inc., IP Division

(57) ABSTRACT

An optical member includes a first region and a second region constituting an interface with an adhesive member. The first region is disposed outside the second region in a second direction intersecting a first direction. An adhesive force generated at an interface between the first region and the adhesive member is smaller than an adhesive force generated at an interface between the second region and the adhesive member.

15 Claims, 8 Drawing Sheets

(56) References Cited

U.S. PATENT DOCUMENTS

| | | | |
|---|---|---|---|
| 2011/0147872 A1 | 6/2011 | Inoue | |
| 2012/0267671 A1* | 10/2012 | Jung | H01L 33/486 |
| | | | 257/99 |
| 2017/0338267 A1* | 11/2017 | Notsu | H01L 27/14618 |

FOREIGN PATENT DOCUMENTS

| | | |
|---|---|---|
| JP | 2007-227608 A | 9/2007 |
| JP | 2008-124161 A | 5/2008 |
| JP | 2002-359314 A | 12/2012 |
| JP | 2013-105846 A | 5/2013 |

* cited by examiner

ELECTRONIC COMPONENT INCLUDING AN OPTICAL MEMBER FIXED WITH ADHESIVE

BACKGROUND

Field

The present disclosure relates to a mount technique and a packaging technique for an electronic device.

Description of the Related Art

An electronic device, such as a photoelectric conversion element, can be packaged into an electronic component, and the electronic component can be incorporated in an electronic apparatus.

Japanese Patent Laid-Open No. 2013-105846 discloses a semiconductor device package including an image sensor, such as a charge coupled device (CCD) or a complementary metal-oxide semiconductor (CMOS). This semiconductor device package includes a photoreceptor in the vicinity of the bottom of the package made of, for example, resin or ceramic, and a glass or resin cover, which is a light-transmissive, flat optical component, on the top. The cover is bonded to the frame of the package with an adhesive member or the like into a unified, closed structure.

In an electronic component, an optical member and an electronic device, or an optical member and a mount member in which an electronic device is disposed are fixed with an adhesive member. When a temperature change occurs during an electronic component manufacturing process and an electronic component, expansion or construction occurs in the optical member constituting the electronic component. This causes stress on an interface between the optical member and the adhesive member. An adhesive force generated at the interface between the optical member and the adhesive member can act as reaction against the stress, possibly causing damage to the optical member.

What is needed is a technique that provides an electronic component in which damage to an optical member can be reduced or eliminated while keeping an adhesive force necessary for bonding the optical member and an electronic device, or the optical member and a mount member in which an electronic device is disposed together.

SUMMARY

An electronic component in an aspect of the present disclosure includes an electronic device, a mount member to which the electronic device is fixed, an optical member facing the electronic device in a first direction, and an adhesive member disposed between the optical member and the mount member to bond the optical member and the mount member together. The optical member includes a first region and a second region, the first region and second region constituting an interface with the adhesive member. The first region is disposed outside the second region in a second direction intersecting the first direction. An adhesive force generated at an interface between the first region and the adhesive member is smaller than an adhesive force generated at an interface between the second region and the adhesive member.

Further features will become apparent from the following description of exemplary embodiments with reference to the attached drawings.

DESCRIPTION OF THE EMBODIMENTS

First Embodiment

Figure 1A:
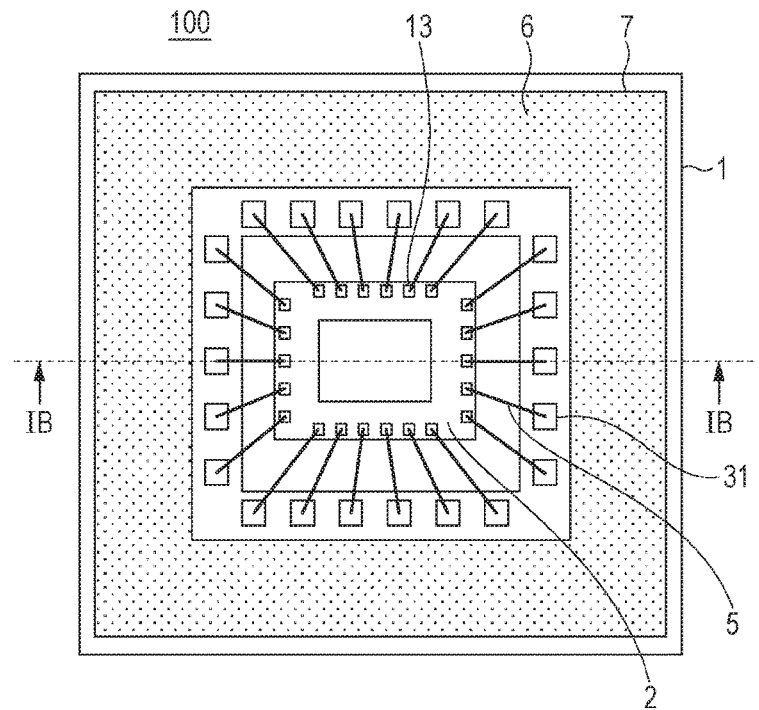
FIG. 1A is a schematic plane view of an electronic component according to a first embodiment of the present disclosure.
Figure 1B:
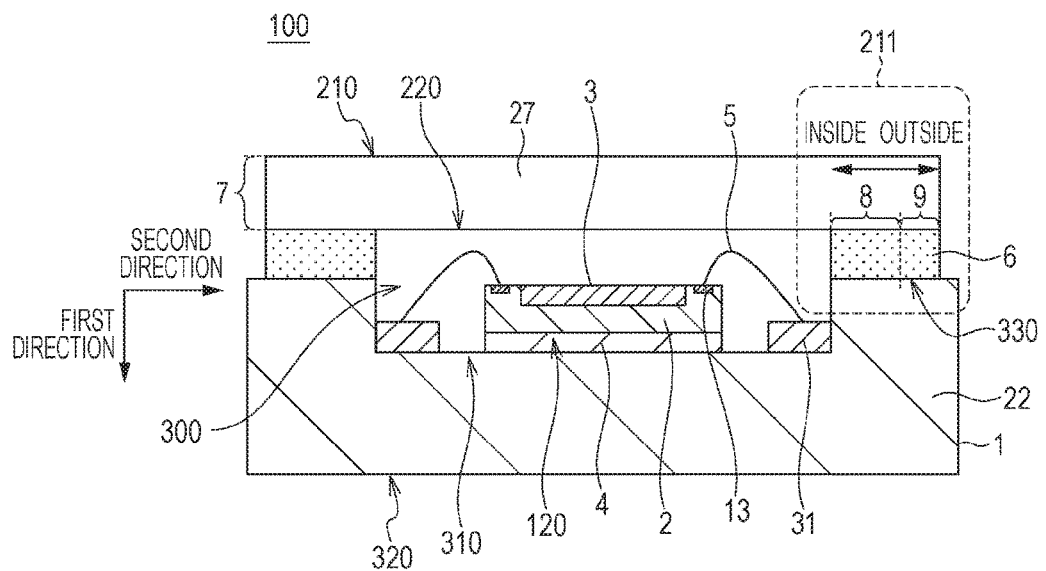
FIG. 1B is a schematic cross-sectional view of the electronic component.

Referring to FIGS. 1A and 1B and FIGS. 2A and 2B, an electronic component 100 according to a first embodiment will be described. FIG. 1A is a schematic plane view of the electronic component 100. FIG. 1B is a schematic cross-sectional view taken along line IB-IB in FIG. 1A.

As illustrated in FIG. 1A, the electronic component 100 includes an electronic device 2, an optical member 7, a mount member 1, an adhesive member 6, wiring lines 5, internal terminals 31, and electrodes 13.

The electronic device 2 according to the present embodiment illustrated in FIG. 1B is a photoelectric conversion element including an image sensor, such as a CMOS sensor or a CCD sensor. The electronic device 2, or the photoelectric conversion element, includes a light receiving region 3 and can be used as, for example, an image sensor, a focusing element (also referred to as a focus detection element), or a light metering element. The light receiving region 3 faces the optical member 7 in a first direction. In the light receiving region 3, the photoelectric conversion element also includes a color filter (not shown) disposed on a light incidence side, a planarizing film (not shown) disposed on the color filter, and a micro lens (not shown).

The electronic device 2 is an electronic device that uses light and includes a photoelectric conversion element. Examples of the electronic device that uses light include a light-emitting element, a light-reflecting element, and a light-transmitting element.

Examples of the light-emitting element include a light-emitting diode and a laser diode. Examples of the light-reflecting element include a reflective liquid-crystal panel and a digital mirror device (DMD). One example of the light-transmitting element is a transmissive liquid-crystal panel. The light-emitting element, the light-reflecting element, and the light-transmitting element can be used as display elements. Another example of the electronic device that uses light is an erasable programmable read-only memory (EPROM).

The optical member 7 includes a base material 27. Examples of the base material 27 include borosilicate glass, crystal, sapphire, phosphate glass, and fluorophosphate glass. For example, in the present embodiment, the base material 27 of the optical member 7 is glass (hereinafter referred to as glass A) made of phosphate glass or fluorophosphate glass. In one example, the glass A is an infrared absorbing glass with an infrared absorbing function.

The optical member 7 has sufficient light transmissivity for the wavelength of light for use in curing the adhesive member 6 (exposure light), that is, an exposure wavelength. The thickness of the optical member 7 is typically 0.1 mm or more and 1 mm or less.

The optical member 7 is opposed to the electronic device 2 in the first direction. Since the optical member 7 has sufficient rigidity, the electronic device 2 is protected by the optical member 7 from adhesion of foreign substances and damage. The optical member 7 also includes a first region 9 and a second region 8 that constitute an interface with the adhesive member 6. The first region 9 is disposed outside the second region 8 in a second direction intersecting the first direction.

A lower surface 220 of the optical member 7 is the surface of the optical member 7 facing the electronic device 2. An upper surface 210 of the optical member 7 is the surface of the optical member 7 opposite the electronic device 2 facing surface, that is, a non-facing surface. While FIG. 1B illustrates the flat optical member 7 in which the upper surface 210 and the lower surface 220 are parallel, the upper surface 210 can have an upward convex curve to provide the function of a lens.

The electronic device 2 is fixed to the mount member 1 by a fixing member 4. Specifically, the electronic device 2 is fixed to the vicinity of the mount member 1 by the fixing member 4 having a thickness of approximately 10 µm to 20 µm. In the present embodiment, the fixing member 4 is disposed between the electronic device 2 and the mount member 1. Alternatively, the fixing member 4 can be disposed so as to cover the edge of the electronic device 2. One example of the fixing member 4 is a thermosetting die bonding member. As another alternative, the electronic device 2 can be fixed to the mount member 1 by fitting or embedding the electronic device 2 in the mount member 1.

The electronic device 2 includes the plurality of electrodes 13 for inputting and outputting electrical signals. The electrodes 13 and the internal terminals 31 are electrically connected via the wiring lines 5. In the present embodiment, the wiring lines 5 are bonding wires, and the electrodes 13 and the internal terminals 31 are connected by wire bonding. Alternatively, the electrodes 13 and the internal terminals 31 can be connected by flip chip bonding. In one example, the wiring lines 5 are metal wires, such as gold wires.

The mount member 1 is constituted by a substrate 22. Examples of the material of the substrate 22 include ceramic, metal, glass epoxy, and resin materials, such as various plastic resins. The mount member 1 is electrically connected to a plurality of external terminals (not shown) disposed on the back surface via the plurality of internal terminals 31 and internal wiring lines (not shown) connected to the plurality of internal terminals 31.

In the present embodiment, the mount member 1 includes a recessed portion 300 constituted by its inner surface 310. The electronic device 2 is housed in the recessed portion 300, and a back surface 120 of the electronic device 2 is bonded to the bottom surface of the recessed portion 300 by the fixing member 4.

The sides of the recessed portion 300 face each other. The internal terminals 31 are provided on the inner surface 310 of the mount member 1 so as to be exposed from the recessed portion 300. The inner surface 310 and an outer surface 320 of the mount member 1 are individually continuous to an upper surface 330.

In the present embodiment, the adhesive member 6 is disposed between the optical member 7 and the mount member 1. This constitutes a closed space. The closed space is filled with gas, such as air or inert gas. The adhesive member 6 is a resin material, such as an ultraviolet curable resin, a thermoset resin, or a thermoplastic resin and is applied by a printing method, a dispenser method, or an ink-jet coating method which are known in the art.

The adhesive member 6 constitutes an interface with the optical member 7. Specifically, the first region 9 and the second region 8 of the optical member 7 and the adhesive member 6 constitute an interface. The adhesive member 6 constitutes an interface with the mount member 1. The optical member 7 and the mount member 1 are bonded together by curing the adhesive member 6.

The optical member 7 and the mount member 1 have different linear coefficients of expansion. For that reason, when a temperature change occurs when the optical member 7 is bonded to the mount member 1 or in a bonded state, stress occurs due to the difference in linear coefficient of expansion. The adhesive force of the adhesive member acts as reaction against the stress. As a result, damage, such as cracking or delamination, can occur in the optical member 7. Examples of the temperature change include a temperature change during a heating process, such as reflowing in a production process, and an air temperature change in an environment in which the electronic component is placed. This stress increases toward the outside (the outer edge) of the optical member 7, possibly causing stronger damage in an outer region (near the outer edge) (the first region 9) of the optical member 7.

To address the above, the optical member 7 of the present embodiment has the first region 9 outside the second region 8, in which a first adhesive force generated at the interface between the first region 9 and the adhesive member 6 is made smaller than a second adhesive force generated at the interface between the second region 8 and the adhesive member 6.

Figure 2A:
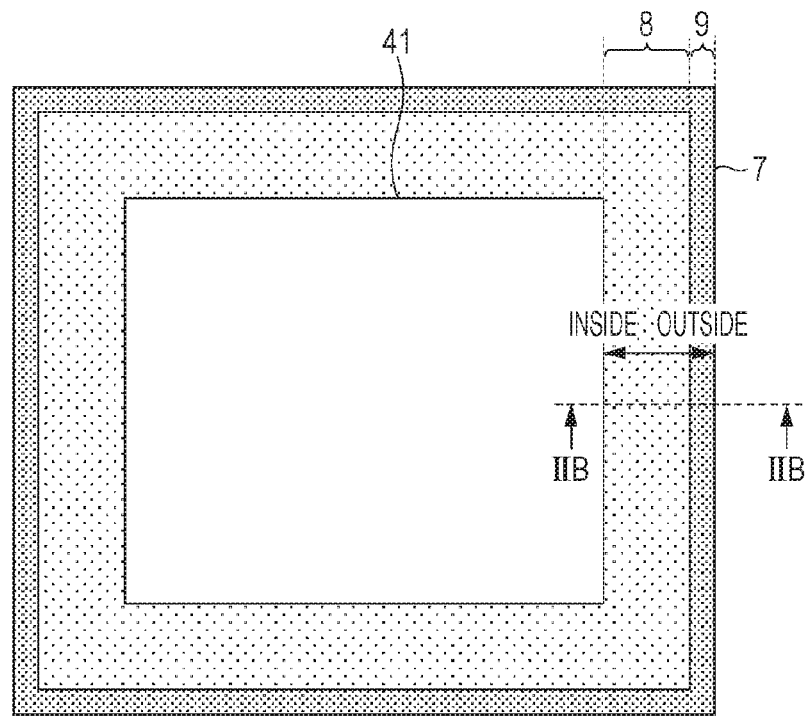
FIG. 2A is a schematic plane view of the electronic component for illustrating an interface between an optical member and an adhesive member.
Figure 2B:
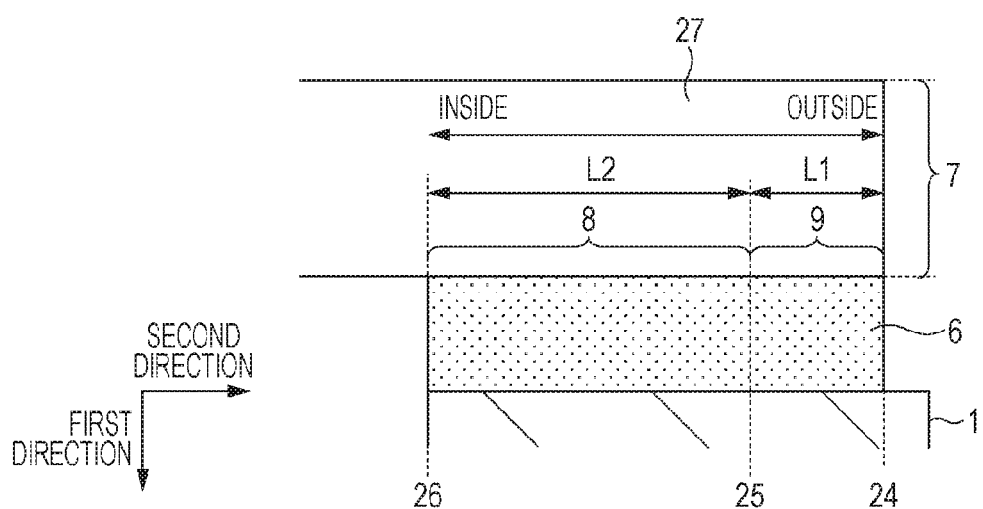
FIG. 2B is a schematic enlarged cross-sectional view of part of FIG. 2A.

Referring next to FIGS. 2A and 2B, the first region 9 and the second region 8 will be described in detail. FIG. 2A is a schematic plane view of the first region 9 and the second region 8 that constitute an interface with the adhesive member 6 and a region 41, which is the recessed portion 300 in plane view, in the optical member 7. The first region 9 and the second region 8 are disposed so as to enclose the outer periphery of the region 41.

FIG. 2B is a schematic enlarged cross-sectional view of a part indicated by a dotted line 211 in the schematic cross-sectional view of FIG. 1B taken along line IIB-IIB in FIG. 2A.

In the optical member 7, the first region 9 is disposed outside the second region 8. The first adhesive force generated at the interface between the first region 9 and the adhesive member 6 is smaller than the second adhesive force generated at the interface between the second region 8 and the adhesive member 6. This can reduce the reaction of the adhesive member 6 at the outer region of the optical member 7 against stress caused by a temperature change. The first adhesive force can be lost, for example, as the adhesive member 6 corresponding to the first region 9 comes off from the optical member 7 as a result of a temperature change.

In contrast, the second adhesive force needs to have sufficient adhesive strength for holding the optical member 7 and the mount member 1 in a fixed state. This can reduce damage to the optical member 7 due to a temperature change while keeping an adhesive force necessary for bonding the optical member 7 and the mount member 1 together. The second adhesive force can change before and after a temperature change but needs to have adhesive strength at least after the temperature change.

The above-described configuration can reduce damage to the outer region of the optical member 7 while keeping an adhesive force necessary for bonding the optical member 7 and the mount member 1 together.

While FIGS. 2A and 2B illustrate an example in which the first direction and the second direction intersect at right angles, the first direction and the second direction need only intersect each other. An example in which the second direction intersects the first direction is a case in which the interface between the optical member 7 and the adhesive member 6 is inclined.

In the present embodiment, the first region 9 is a region from a first end 24 at the outer side of the optical member 7 to a second end 25. The second region 8 is a region from the second end 25 to a third end 26 of the optical member 7. A length L1 from the first end 24 to the second end 25 is smaller than a length L2 from the second end 25 to the third end 26. In other words, the length L1 of the first region 9 is smaller than the length L2 of the second region 8.

If the length L1 is made larger than the length L2, the mount member 1 could unnecessarily be increased in size. The increase in the size of the mount member 1 will increase the influence of the linear coefficient of expansion due to a temperature change, increasing damage to the outer region of the optical member 7.

The configuration of the present embodiment can reduce damage to the first region 9 on the outer side of the optical member 7 while keeping an adhesive force necessary for bonding the optical member 7 and the mount member 1 together.

The area of the first region 9 in plane view can be smaller than the area of the second region 8 in plane view. This configuration can also reduce damage to the first region 9 while keeping an adhesive force necessary for bonding the optical member 7 and the mount member 1 together.

Appropriate values of the length L1 of the first region 9 and the length L2 of the second region 8 vary depending on the size of the mount member 1. For example, a photoelectric conversion element is used as the electronic device 2, the length L1 of the first region 9 is approximately 0.1 mm≤L1<0.5 mm, and the length L2 is approximately 0.5 mm≤L2≤2.5 mm.

The second adhesive force generated at the interface between the second region 8 and the adhesive member 6 is typically 2.5 kg/mm$^2$ or more. If the adhesive force of the second region 8 is smaller than 2.5 kg/mm$^2$, the optical member 7 and the mount member 1 cannot be bonded together in the second region 8 when a temperature change occurs. The first adhesive force generated at the interface between the first region 9 and the adhesive member 6 is typically 1.5 kg/mm$^2$ or less. If the first adhesive force exceeds 1.5 kg/mm$^2$, the reaction against the stress generated due to a temperature change increases, so that damage is likely to occur in the outer region of the optical member 7.

Stress that can be caused by a difference in the linear coefficients of expansion of the mount member 1 and the optical member 7 can be reduced by selecting materials having near linear coefficients of expansion for the mount member 1 and the optical member 7.

For example, the linear coefficient of expansion of the glass A made of phosphate glass or fluorophosphate glass described above for the optical member 7 is larger than those of other glasses (for example, crystal and sapphire). In general, the linear coefficient of expansion of the optical member 7 is larger than the linear coefficient of expansion of the mount member 1. Therefore, the optical member 7 made of the glass A is larger in the difference in linear coefficient of expansion between the optical member and the mount member 1 than the optical member 7 made of other glass. For that reason, when the glass A is used as the optical member 7, a plastic resin with a linear coefficient of expansion closer to that of the glass A than the other materials can be used for the mount member 1.

Thus, the present embodiment can reduce damage to the optical member 7 due to a temperature change while keeping an adhesive force necessary for bonding the optical member 7 and the mount member 1 together.

EXAMPLE 1

Figure 3A:
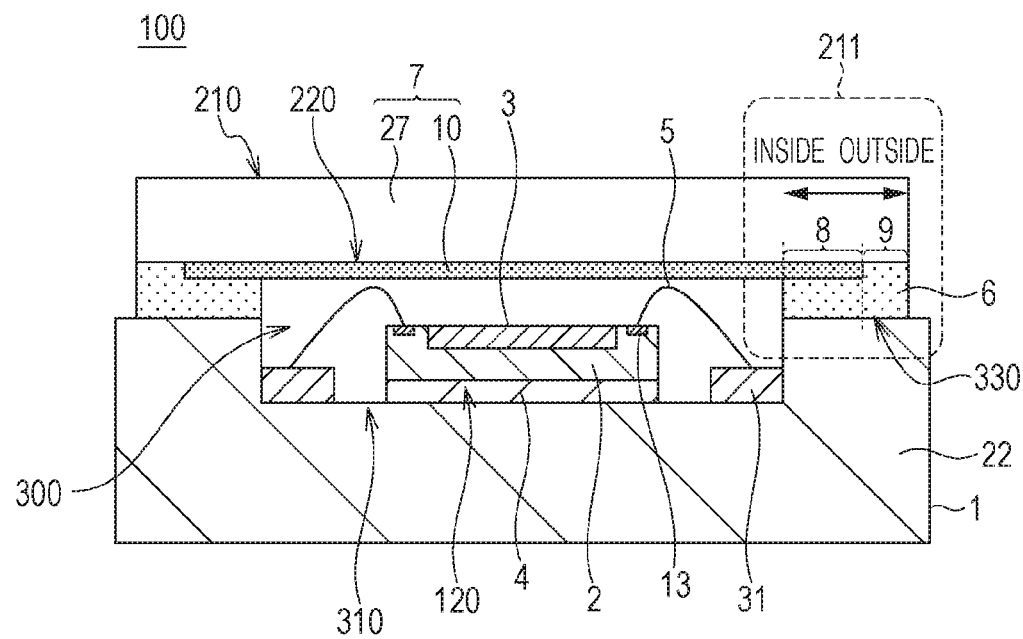
FIG. 3A is a schematic cross-sectional view of an electronic component.
Figure 3B:
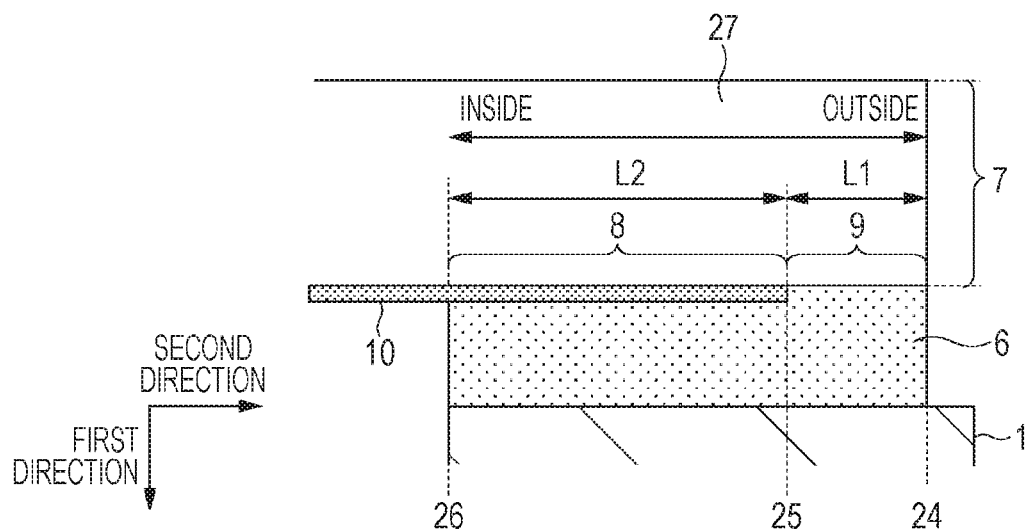
FIG. 3B is a schematic cross-sectional view of part of FIG. 3A.

Referring to FIGS. 3A and 3B, an electronic component 100 of Example 1 will be described. Parts given the same reference signs as those in FIGS. 1A and 1B and FIGS. 2A and 2B are the same components or regions. In the electronic component 100 of Example 1, the second region 8 of the optical member 7 is constituted by the base material 27 and a film 10 (a protective film) that protects part of the interface, and the first region 9 of the optical member 7 is constituted by the base material 27 without the film 10.

FIG. 3A is a schematic cross-sectional view, and FIG. 3B is an enlarged view of a part indicated by the dotted line 211 in the schematic cross-sectional view of FIG. 3A. In FIG. 3B, the second region 8 is constituted by the base material 27 and the film 10, and the first region 9 is constituted by the base material 27.

The advantageous effect of the configuration in which the second region 8 includes the film 10 will be described. In the second region 8, the base material 27 is coated with the film 10 for protection. This makes it easy to avoid contact between the base material 27 and moisture, preventing contact between the base material 27 and moisture in the second region 8. This enables preventing the adhesive force from being reduced with age, making it easy to maintain the function of fixing the optical member 7 and the mount member 1 together (adhesive force).

In contrast, the first region 9 in which the film 10 is not provided tends to absorb moisture, so that the first adhesive force generated at the interface between the first region 9 and the adhesive member 6 can be reduced. This reduces damage to the outer region (the first region) of the optical member 7.

In a case where the film 10 is a film with an antireflection function in addition to the protective function, the reflectance at an interface between the optical member 7 and air is reduced, so that light incident on the light receiving region 3 of the electronic component 100 can be increased. In other words, in the case where the electronic component 100 is a photoelectric conversion element, its sensitivity can be improved.

Materials for the optical member 7 and the film 10 can be appropriately selected provided that the first adhesive force generated at the interface with the first region 9 and the second adhesive force generated at the interface with the second region 8 are made different. The film 10 can be a single-layer film of silicon oxide, magnesium fluoride, titanium oxide, niobium pentoxide, or the like or a multi-layer film in which single-layer films are laminated. In Example 1, a diagram in which a single-layer film of silicon dioxide ($SiO_2$) is formed as an example.

In the case where the base material 27 of the optical member 7 is the glass A, the film 10 particularly offers the advantage. This is because the region in which the film 10 is disposed is prevented from decreasing in adhesive force with age against an early decrease in adhesive force with age because of the low water resistance of the glass A.

Depending on the combination of the materials of the optical member 7 and the film 10, the adhesive force at the interface of the region including the film 10 can be lower than the adhesive force at the interface with the region of the base material 27 (for example, the optical member 7 is made of borosilicate glass, and the film 10 is a laminated film). In such a case, constituting the first region 9 by the film 10 and the base material 27 and constituting the second region 8 by the base material 27 makes the first adhesive force generated at the interface with the first region 9 smaller than the second adhesive force generated at the interface with the second region 8.

Experimental Example of Example 1

The electronic component 100 of Example 1 illustrated in FIG. 3B was produced, and its advantageous effect was checked. In this case, an image sensor of APS-C size of 24 mm×20 mm was used as the electronic device 2. This image sensor was fixed by thermal curing to almost in the center of the recessed portion 300 of the mount member 1 using a black die-bonding member as the fixing member 4. Thereafter, the electrodes 13 provided around the image sensor and the internal terminals 31 were electrically connected by metal wires, or the wiring lines 5, using a wire bonding apparatus.

Next, the glass A with an external form of 33.5 mm×27.5 mm and a thickness of 0.5 mm in which a silicon dioxide protective film 10 was disposed in the entire area of the lower surface 220 excluding an outer periphery of about 300 μm in width was used as the base material 27 of the optical member 7.

A single-layer film made of silicon dioxide with a thickness of about 80 nm was formed as the film 10 on the base material 27. The optical member 7 and the mount member 1 were bonded and fixed together using the ultraviolet curable adhesive member 6. In the bonding process, the adhesive member was cured by applying ultraviolet rays and heat. The optical member 7 thus includes the second region 8 formed of the base material 27 and the film 10 and the first region 9 formed of the base material 27.

Twenty electronic components 100 were produced by the series of manufacturing steps, and appearance observation was performed after the production. The observation showed that cracking and delamination, which are damage to the outer region of the optical member 7, are at practically acceptable level.

After the moisture of the produced electronic components 100 was absorbed under predetermined moisture absorbing conditions, the electronic components 100 were put into a reflow furnace with a peak temperature of 190° C. Appearance observation of the electronic components 100 performed after the reflowing showed that cracking and delamination are at practically acceptable level.

In addition to the above twenty electronic components 100, five electronic components 100 were produced by similar producing steps. For the five electronic components 100, optical members 7 whose first region 9 is 1.5 mm in width were produced. In these electronic components 100, samples in which the optical member 7 and the mount member 1 were cut out into a size of 1.5 mm square, with the optical member 7 and the mount member 1 bonded together with the adhesive member 6, were produced. In this case, a sample with a size of 1.5 mm square was cut out from each of the first region 9 and the second region 8. Thereafter, adhesive forces in terms of shear strength were measured. The measurement showed that the first adhesive force generated at the interface between the first region 9 and the adhesive member 6 is smaller than the second adhesive force of the adhesive member 6 generated at the interface between the second region 8 and the adhesive member 6.

As described above, Example 1 can reduce damage to the outer region of the optical member 7 caused by a temperature change while keeping an adhesive force necessary for bonding the optical member 7 and the mount member 1 together.

EXAMPLE 2

Figure 4:
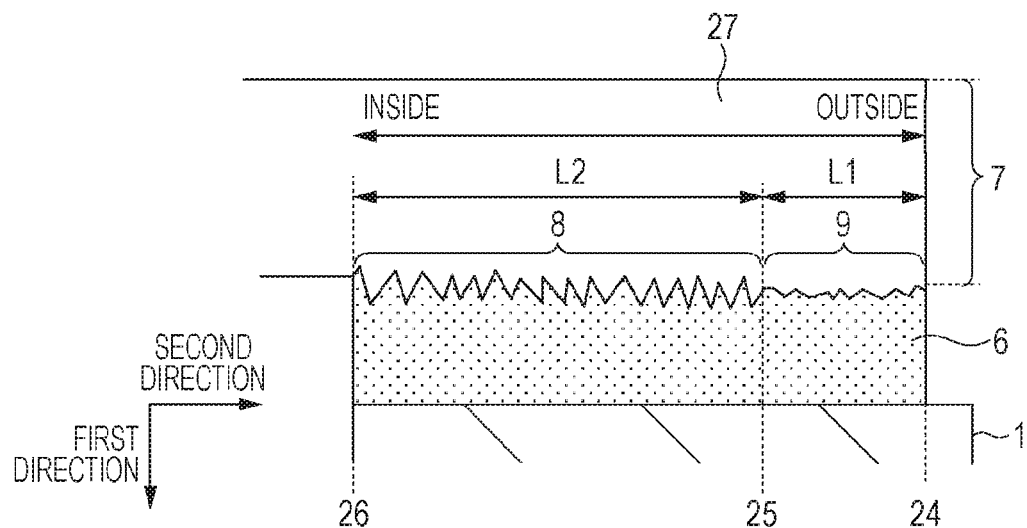
FIG. 4 is a schematic cross-sectional view for illustrating an interface between an optical member and an adhesive member.

Referring to FIG. 4, an electronic component 100 of Example 2 will be described. Parts given the same reference signs as those in FIGS. 1A and 1B to FIGS. 3A and 3B are the same components or regions. In the electronic component 100 of Example 2, the optical member 7 has a rough surface in the first region 9 and the second region 8 in addition to the configuration illustrated in FIGS. 1A and 1B. The roughness of the surface of the second region 8 is higher than the roughness of the surface of the first region 9.

The schematic cross-sectional view in FIG. 4 is an enlarged view of the first region 9 and the second region 8. In Example 2, the roughness of the second region 8 is higher than the roughness of the first region 9. As a result, the first adhesive force generated at the interface between the first region 9 and the adhesive member 6 is smaller than the second adhesive force generated at the interface between the second region 8 and the adhesive member 6. This is because the roughness of the surface of the second region 8 increases the surface area of the interface and therefore increases the adhesive force.

Examples of a method for making the roughness of the first region 9 and the roughness of the second region 8 different are as follows. A first method is roughly grinding a region including at least the second region 8 and excluding the first region 9 of the optical member 7. A second method is grinding only the first region 9 or a region excluding the second region 8 (including the first region 9) of the optical member 7 so as to become flat. Either method can make the roughness of the second region 8 higher than the roughness of the first region 9. Examples of a method of grinding include sandblasting, mechanical grinding, and other known methods.

Experimental Example of Example 2

The electronic component 100 of Example 2 illustrated in FIG. 4 was produced, and its advantageous effect was checked. Except for the film 10, the configuration is the same as the configuration described in Example 1. In the optical member 7, the portion corresponding to the second region 8 and the portion corresponding to the first region 9 were subjected to the above-described sandblasting process. In the sandblasting process, the first region 9 and the second region 8 with different roughness were formed by changing the particle diameter.

The same evaluation experiment as that of Example 1 was performed to observe the appearance of the electronic component 100. The appearance observation showed that cracking and delamination, which is damage to the outer region (first region 9) of the optical member 7, is at practically allowable level. Measurement of the adhesive forces in terms of shear strength showed that the first adhesive force generated at the interface between the first region 9 and the adhesive member 6 is smaller than the second adhesive force generated at the interface between the second region 8 and the adhesive member 6.

As described above, Example 2 can reduce damage to the outer region of the optical member 7 caused by a temperature change while keeping an adhesive force necessary for bonding the optical member 7 and the mount member 1 together.

EXAMPLE 3

Figure 5:
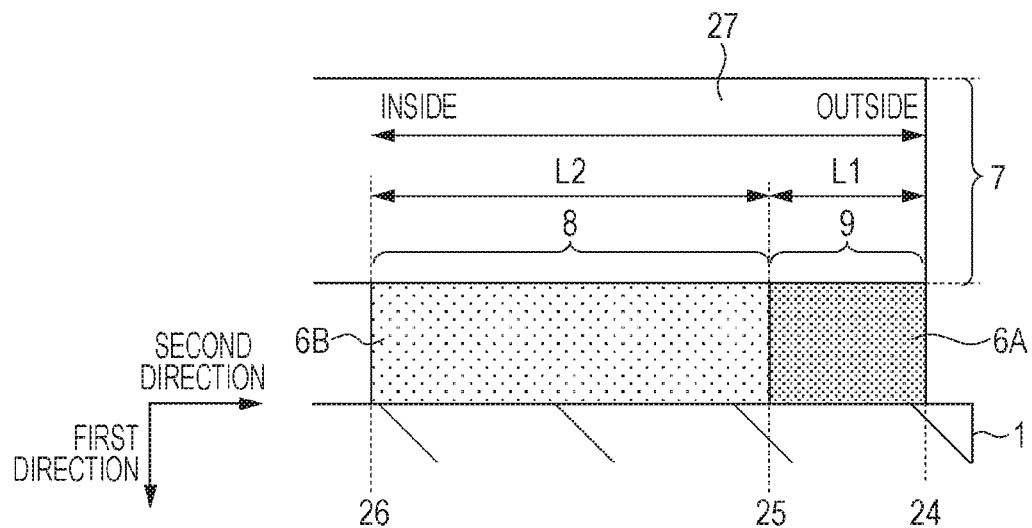
FIG. 5 is a schematic cross-sectional view for illustrating an interface between an optical member and an adhesive member.

Referring to FIG. 5, an electronic component 100 of Example 3 will be described. Parts given the same reference signs as those in FIGS. 1A and 1B to FIG. 4 are the same components or regions. In addition to the configuration illustrated in FIGS. 1A and 1B, the electronic component 100 of Example 3 includes a configuration in which the hardness of an adhesive member 6B that constitutes an interface with the second region 8 is higher than the hardness of an adhesive member 6A that constitutes an interface with the first region 9. Such a configuration makes the adhesive force generated at the interface between the first region 9 and the adhesive member 6B smaller than the adhesive force generated at the interface between the second region 8 and the adhesive member 6A.

One example of a method for forming the adhesive member 6A and the adhesive member 6B having different degrees of hardness in the adhesive member 6 is using an ultraviolet curable resin as the adhesive member 6. In other words, the adhesive member 6 is irradiated with ultraviolet rays, with the adhesive member 6A that constitutes an interface with the first region 9 covered with a light shielding mask or a reflected light mask. This makes the hardness of the adhesive member 6B that constitutes an interface with the second region 8 higher than the hardness of the adhesive member 6A that constitutes an interface with the first region 9 to make the hardness of the second region 8 higher than the hardness of the first region 9.

Experimental Example of Example 3

The electronic component 100 illustrated in FIG. 5 was produced, and its advantageous effect was checked. Except for the film 10, the configuration is the same as the configuration described in Example 1.

In curing the ultraviolet curable adhesive member 6, the ultraviolet curable resin was cured using a translucent light-shielding mask for a portion corresponding to the first region 9 and not using the translucent light-shielding mask for the second region 8. This can vary light energy to be applied to the ultraviolet curable resin, making the hardness of the second region 8 and the first region 9 different.

The same evaluation experiment as that of Example 1 was performed to observe the appearance of the electronic component 100. The appearance observation showed that cracking and delamination, which is damage to the outer region (first region 9) of the optical member 7, is at practically allowable level. Measurement of the adhesive forces in terms of shear strength showed that the first adhesive force generated at the interface between the first region 9 and the adhesive member 6 is smaller than the second adhesive force generated at the interface between the second region 8 and the adhesive member 6.

As described above, Example 3 can reduce damage to the optical member 7 caused by a temperature change while keeping an adhesive force necessary for bonding the optical member 7 and the mount member 1 together.

Second Embodiment

Referring to FIGS. 6A and 6B and FIGS. 7A and 7B, an electronic component 100 of the present embodiment will be described. Parts given the same reference signs as those in FIGS. 1A and 1B to FIG. 5 are the same components or regions. The electronic component 100 of the present embodiment differs from the first embodiment in that the recessed portion 300 is not provided and that a bonding layer d made of the adhesive member 6 is provided between the optical member 7 and the mount member 1. Here, only differences from the first embodiment will be described.

Figure 6A:
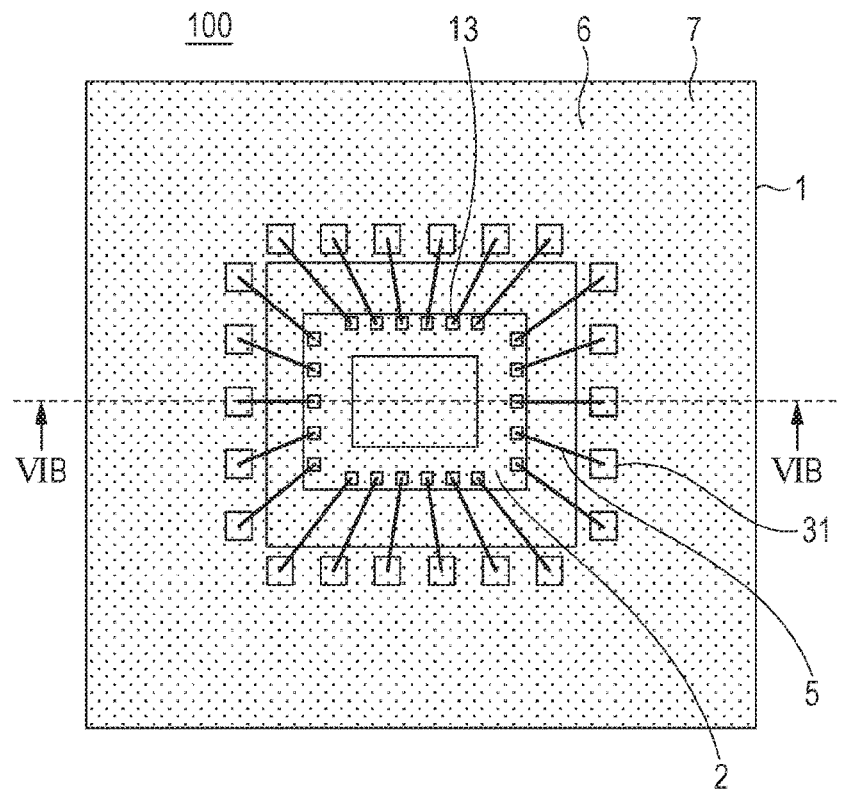
FIG. 6A is a schematic plane view of an electronic component according to a second embodiment of the present disclosure.

FIG. 6A is a schematic plane view of the electronic component 100. In FIG. 6A, the bonding layer 19 is configured to overlap with the entire area in which the mount member 1 and the optical member 7 overlap with one another in plane view. In the present embodiment, the optical member 7 includes a bonding region 23 that constitutes an interface with the bonding layer 19. Below, the entire area of the optical member 7 will be described as overlapping with the mount member 1 in plane view. However, if a partial area of the optical member 7 does not overlap with the mount member 1 in plane view, the bonding layer 19 is not formed in that area.

Figure 6B:
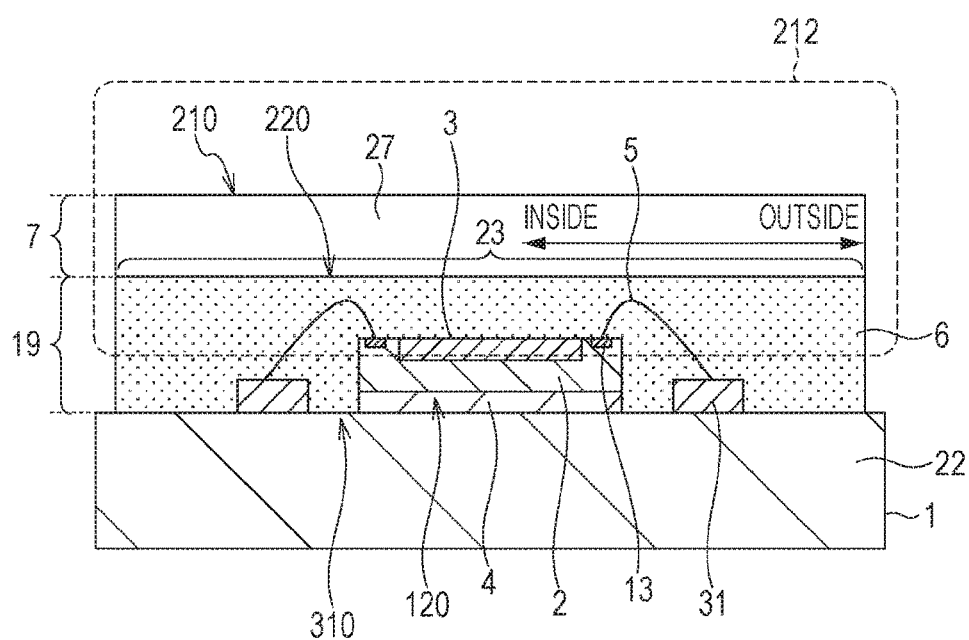
FIG. 6B is a schematic cross-sectional view of the electronic component.

FIG. 6B is a schematic cross-sectional view taken along line VIB-VIB in FIG. 6A. The adhesive member 6 is disposed so as to constitute an interface with the entire area of the lower surface 220 of the optical member 7, so that the mount member 1 and the optical member 7 are fixed together.

Here, the adhesive member 6 is filled with a light transmissive member to form the bonding layer 19. One example of the light transmissive member is an ultraviolet curable resin, such as an epoxy resin. In the case where a light transmissive member is disposed between the optical member 7 and the mount member 1, the optical member 7 and the mount member 1 are bonded together by ultraviolet curing.

The mount member 1 includes the internal terminals 31 and the wiring lines 5 on the front surface, and external electrodes on the back surface (not shown) and is formed of an organic substrate, such as FR4 or BT-resin.

Figure 7A:
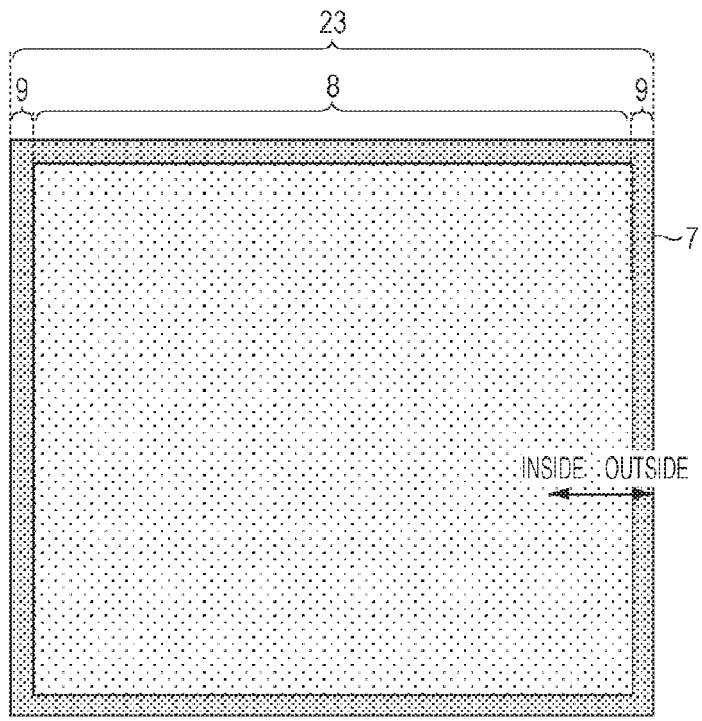
FIG. 7A is a schematic plane view of the electronic component for illustrating an interface between an optical member and an adhesive member.

FIG. 7A is a schematic plane view of the optical member 7 and the bonding region 23. As illustrated in FIG. 6B, the entire area of the lower surface 220 of the optical member 7 is the bonding region 23. The bonding region 23 includes the first region 9 and the second region 8. A region of the bonding region 23 excluding the first region 9 is the second region 8.

Figure 7B:
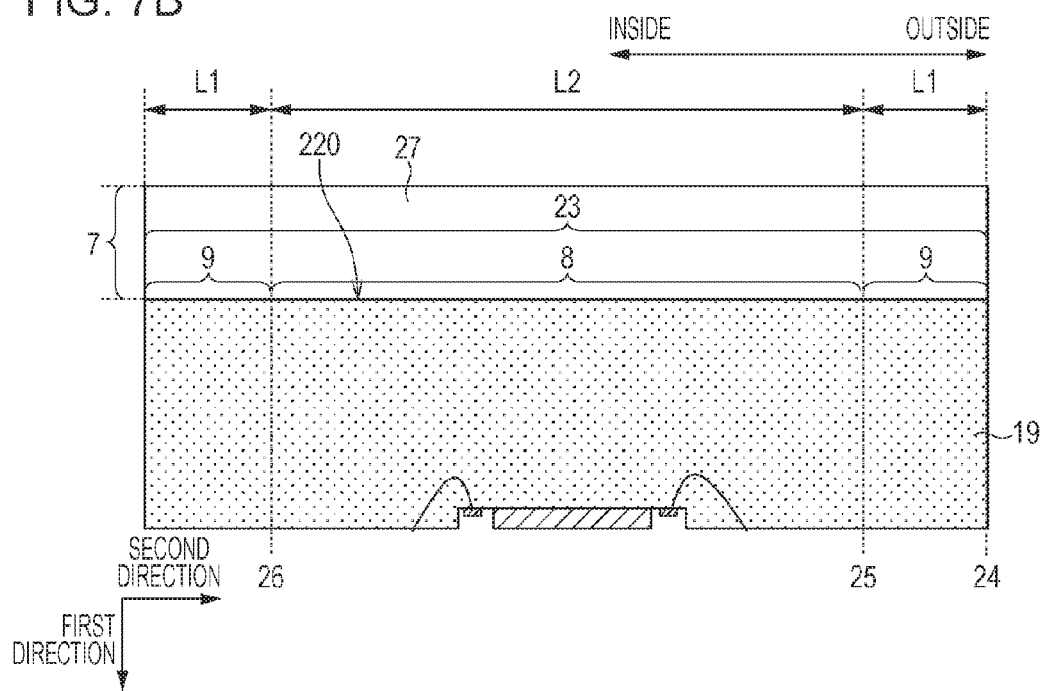
FIG. 7B is a schematic cross-sectional view of FIG. 7A.

The schematic cross-sectional view shown in FIG. 7B is an enlarged view of a part indicated by a dotted line 212 in FIG. 6B. The bonding region 23 includes the first region 9 and the second region 8. The first region 9 is from a first end 24 at the outer side of the optical member 7 to a second end 25. The second region 8 is from the second end 25 to a third end 26. The length L1 from the first end 24 to the second end 25 is smaller than the length L2 from the second end 25 to the opposite third end 26 across the second region 8. In other words, the length L1 of the first region 9 is smaller than the length L2 of the second region 8.

In the present embodiment, the above-described examples can be applied.

Third Embodiment

Figure 8A:
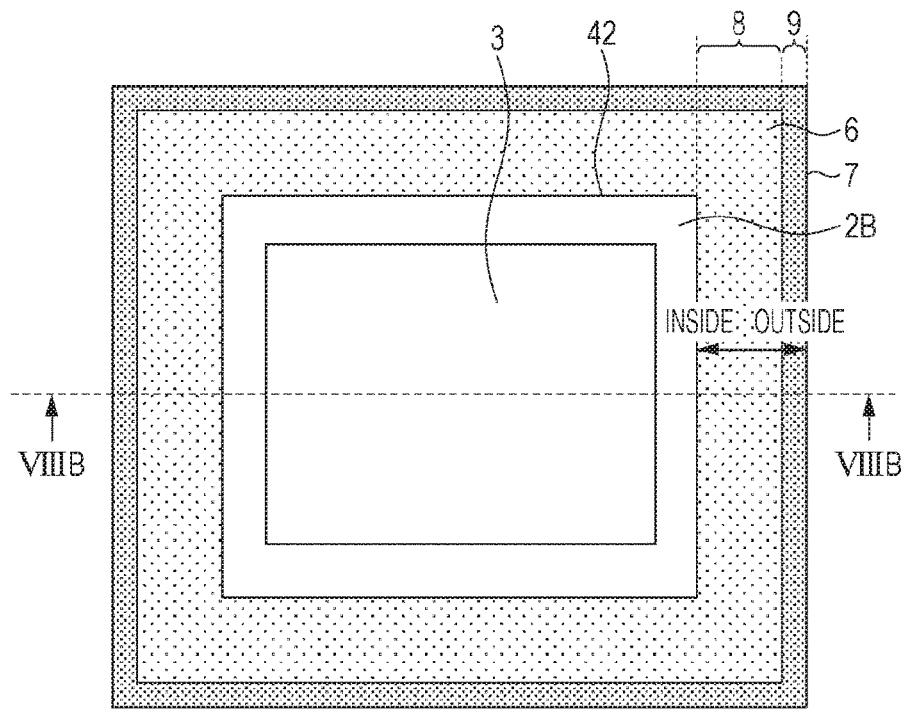
FIG. 8A is a schematic plane view of an electronic component according to a third embodiment of the present disclosure.
Figure 8B:
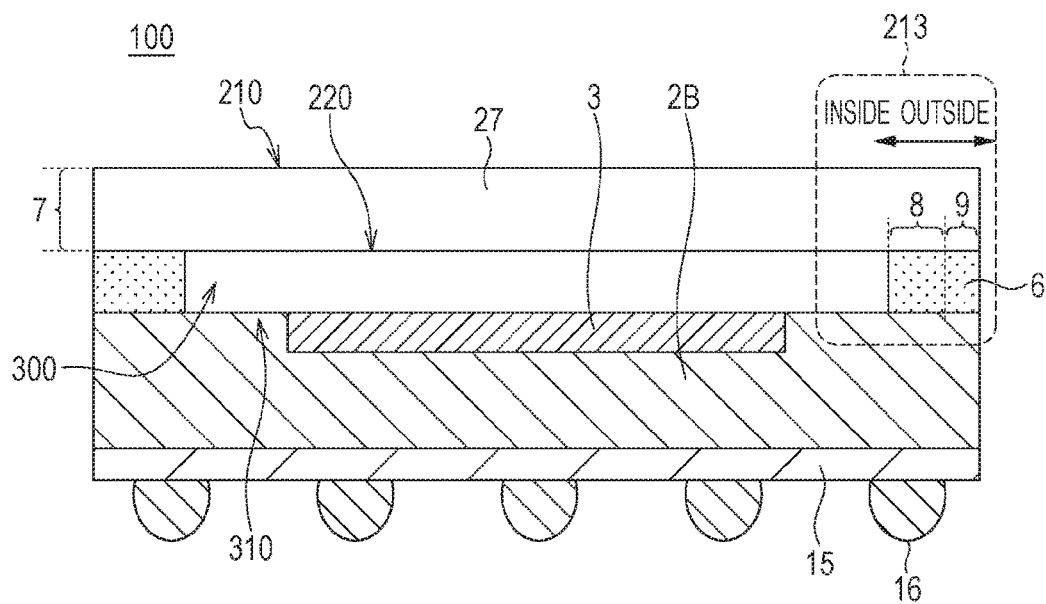
FIG. 8B is a schematic cross-sectional view of the electronic component.
Figure 9:
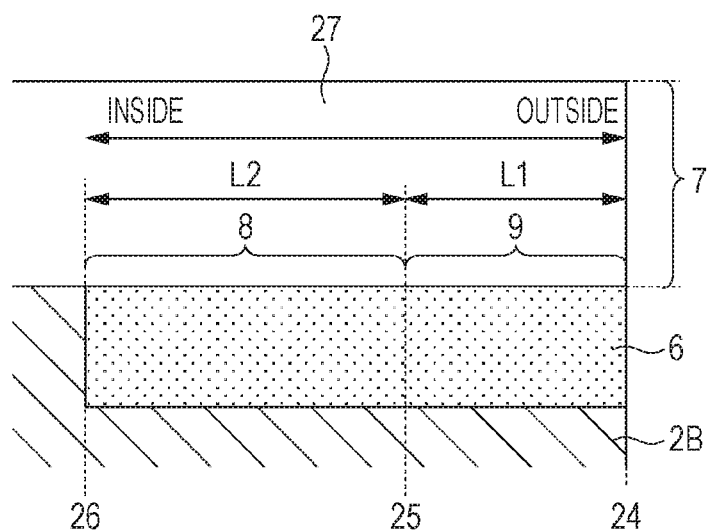
FIG. 9 is a schematic cross-sectional view for illustrating an interface between an optical member and an adhesive member.

Referring to FIGS. 8A and 8B and FIG. 9, an electronic component 100 of the present embodiment will be described. FIG. 8A is a schematic plane view of the electronic component 100. FIG. 8B is a schematic cross-sectional view taken along line VIIIB-VIIIB in FIG. 8A. Parts given the same reference signs as those in FIGS. 1A and 1B to FIGS. 7A and 7B are the same components or regions. Here, only differences from the first embodiment will be described.

As illustrated in FIG. 8A, the electronic component 100 of the present embodiment includes an electronic device 2B, the adhesive member 6, and the optical member 7 and does not include the mount member 1. In the present embodiment, the adhesive member 6 is disposed so that the first region 9 and the second region 8 enclose the outer periphery of a region 42, as in FIG. 2A of the first embodiment.

In the present embodiment, the optical member 7 and the electronic device 2B include different linear coefficients of expansion. For that reason, when a temperature change occurs when the optical member 7 is bonded to the electronic device 2B or in a bonded state, stress occurs due to the difference in linear coefficient of expansion. The adhesive force of the adhesive member acts as reaction against the stress. As a result, damage, such as cracking or delamination, can occur in the optical member 7.

Next, FIG. 8B will be described. In the present embodiment, the electronic device 2B and the optical member 7 opposed to the electronic device 2B in the first direction are directly fixed by the adhesive member 6. This is generally referred to as "chip-size package (CSP)", in which the above-described mount member 1 is not provided, so that the electronic component 100 can be made equal in size to the electronic device 2B, thereby achieving size reduction.

The electronic device 2B differs from the electronic device 2 of the first and second embodiments in including silicon through-electrodes (not shown) in the electronic device 2B and including a rewiring layer 15 and back surface electrodes 16 on the back surface. Disposing the back surface electrodes 16 directly on the electronic device 2B eliminates the need for the wiring lines 5 illustrated in the diagrams of the first embodiment. The rewiring layer 15 is made of copper or the like, and the back surface electrodes 16 are made of solder or the like.

In the present embodiment, the adhesive member 6 is disposed between the optical member 7 and the electronic device 2B. The adhesive member 6 constitutes an interface with the optical member 7 (the first region 9 and the second region 8). The adhesive member 6 constitutes an interface with the electronic device 2B. By curing the adhesive member 6, the optical member 7 and the electronic device 2B are bonded together.

Also in the present embodiment, the optical member 7 includes the first region 9 outside the second region 8, and the first adhesive force generated at the interface between the first region 9 and the adhesive member 6 is smaller than the second adhesive force generated at the interface between the second region 8 and the adhesive member 6.

In the present embodiment, each of the above-described examples can be applied. Also in the present embodiment, the bonding layer may be provided as in the second embodiment.

The present technique can provide an electronic component in which damage to an optical member can be reduced or eliminated while keeping an adhesive force necessary for bonding the optical member and an electronic device, or the optical member and a mount member in which an electronic device is disposed together.

While exemplary embodiments have been described, it is to be understood that these exemplary embodiments are not seen to be limiting. The scope of the following claims is to be accorded the broadest interpretation so as to encompass all such modifications and equivalent structures and functions.

This application claims the benefit of Japanese Patent Application No. 2016-100329 filed May 19, 2016, which is hereby incorporated by reference herein in its entirety.

What is claimed is:

1. An electronic component comprising:
   an electronic device;
   a mount member to which the electronic device is fixed;
   an optical member facing the electronic device in a first direction; and
   an adhesive member disposed between the optical member and the mount member to bond the optical member and the mount member together,
   wherein the optical member comprises a base material and a film disposed between the base material and the adhesive member,
   wherein the optical member further comprises a first region and a second region, the first region being disposed outside the second region in a second direction intersecting the first direction, the second region being constituted by the base material and the film, the first region being constituted by the base material, the first region and the second region constituting an interface with the adhesive member,
   wherein a length L1 of the first region in the second direction satisfies 0.1 mm≤L1<0.5 mm, and a length L2 of the second region in the second direction satisfies 0.5 mm≤L2≤2.5 mm, and
   wherein an adhesive force generated at an interface between the first region and the adhesive member is less than or equal to 1.5 kg/mm$^2$ and an adhesive force generated at an interface between the second region and the adhesive member is greater than or equal to 2.5 kg/mm$^2$.

2. The electronic component according to claim 1, wherein the optical member has a larger linear coefficient of expansion than the electronic device.

3. The electronic component according to claim 1, wherein the optical member has a larger linear coefficient of expansion than the mount member.

4. The electronic component according to claim 1, wherein the film comprises a region facing the electronic device in the first direction.

5. The electronic component according to claim 1, wherein the base material of the first region constitutes a first part of the interface with the adhesive member, and the film of the second region constitutes a second part of the interface with the adhesive member.

6. An electronic component comprising:
   an electronic device;

an optical member facing the electronic device in a first direction; and an adhesive member disposed between the optical member and a mount member to bond the optical member and the mount member together, wherein the optical member comprises a base material and a film disposed between the base material and the adhesive member, wherein the optical member further comprises a first region and a second region, the first region being disposed outside the second region in a second direction intersecting the first direction, the second region being constituted by the base material and the film, the first region being constituted by the base material, the first region and the second region constituting an interface with the adhesive member, wherein a length L1 of the first region in the second direction satisfies 0.1 mm≤L1<0.5 mm, and a length L2 of the second region in the second direction satisfies 0.5 mm ≤L2≤2.5 mm, and wherein an adhesive force generated at an interface between the first region and the adhesive member is less than or equal to 1.5 kg/mm$^2$ and an adhesive force generated at an interface between the second region and the adhesive member is greater than or equal to 2.5 kg/mm$^2$.

7. The electronic component according to claim 6, wherein the first region has a smaller area than the second region.

8. An electronic component comprising:

an electronic device;

a mount member to which the electronic device is fixed;

an optical member facing the electronic device in a first direction; and a resin material disposed between the optical member and the mount member, wherein the optical member comprises a first region and a second region, the first region and the second region constituting an interface with the resin material, wherein the first region is disposed outside the second region in a second direction intersecting the first direction, wherein the optical member comprises glass made of either phosphate glass or fluorophosphate glass and a silicon oxide film, at least a part of the silicon oxide film is disposed between the phosphate or fluorophosphate glass and the resin material in the first direction, and wherein the interface between the second region and the resin material is constituted by the silicon oxide film, and the interface between the first region and the resin material is constituted by the phosphate or fluorophosphate glass, wherein the interface between the silicon oxide film of the second region and the resin material is wider in the second direction than the interface between the phosphate or fluorophosphate glass of the first region and the resin material.

9. The electronic component according to claim 8, wherein the resin material comprises an ultraviolet curable resin.

10. The electronic component according to claim 9, wherein a length L1 of the first region in the second direction satisfies 0.1 mm≤L1<0.5 mm, and a length L2 of the second region in the second direction satisfies 0.5 mm≤L2≤2.5 mm.

11. The electronic component according to claim 10, wherein the mount member is formed of resin, and the optical member comprises glass made of fluorophosphate glass.

12. The electronic component according to claim 8, wherein the silicon oxide film comprises another part directly facing a space between the optical member and the electronic device in the first direction.

13. The electronic component according to claim 12, wherein the silicon oxide film is in contact with the phosphate or fluorophosphate glass.

14. The electronic component according to claim 13, wherein the phosphate or fluorophosphate glass has a larger linear coefficient of expansion than the mount member.

15. The electronic component according to claim 8, wherein the electronic device comprises a photoelectric conversion element, and wherein a light receiving region of the photoelectric conversion element and the silicon oxide film face each other in the first direction.

* * * * *